(12) United States Patent
Miyaki et al.

(10) Patent No.: US 6,989,334 B2
(45) Date of Patent: Jan. 24, 2006

(54) MANUFACTURING METHOD OF A SEMICONDUCTOR DEVICE

(75) Inventors: Yoshinori Miyaki, Tachikawa (JP); Hiromichi Suzuki, Higashiyamato (JP); Kazunari Suzuki, Tokyo (JP); Takafumi Nishita, Iruma (JP); Fujio Ito, Hanno (JP); Kunihiro Tsubosaki, Hino (JP); Akihiko Kameoka, Saitama (JP); Kunihiko Nishi, Kokubunji (JP)

(73) Assignees: Renesas Technology Corp., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 116 days.

(21) Appl. No.: 10/437,916

(22) Filed: May 15, 2003

(65) Prior Publication Data

US 2003/0207572 A1 Nov. 6, 2003

Related U.S. Application Data

(62) Division of application No. 09/381,400, filed as application No. PCT/JP98/01219 on Mar. 20, 1998, now abandoned.

(51) Int. Cl.
*H01L 21/302* (2006.01)
(52) U.S. Cl. .................. 438/745; 438/15; 438/112; 438/750; 430/312
(58) Field of Classification Search .............. 438/15, 438/26, 110, 111, 112, 113, 745, 750; 430/311, 430/312, 313, 314
See application file for complete search history.

(56) References Cited

U.S. PATENT DOCUMENTS

| 5,530,286 A | * | 6/1996 | Murakami et al. ......... 257/692 |
| 5,536,970 A | | 7/1996 | Higashi et al. |
| 5,637,913 A | | 6/1997 | Kajihara et al. |
| 5,814,894 A | | 9/1998 | Igarashi et al. |
| 5,864,174 A | | 1/1999 | Yamada et al. |
| 5,885,852 A | | 3/1999 | Kishikawa et al. |
| 5,895,969 A | | 4/1999 | Masuda et al. |
| 5,990,003 A | * | 11/1999 | Oda ......................... 438/637 |
| 6,147,374 A | | 11/2000 | Tanaka et al. |
| 6,157,074 A | | 12/2000 | Lee |

FOREIGN PATENT DOCUMENTS

| JP | 63204753 | 8/1988 |
| JP | 63216303 | 9/1988 |
| JP | 63271939 | 11/1998 |

* cited by examiner

*Primary Examiner*—Lan Vinh

(74) *Attorney, Agent, or Firm*—Antonelli, Terry, Stout & Kraus, LLP.

(57) ABSTRACT

The occurrence of a package crack in the back vicinity of a die pad is restrained by making the outward appearance of the die pad of a lead frame smaller than that of a semiconductor chip which is mounted on it, and also the occurrence of a package crack in the main surface vicinity of the semiconductor chip is restrained by forming a layer of organic material with good adhesion property with the resin that constitutes the package body on the final passivation film (final passivation film) that covers the top layer of conductive wirings of the semiconductor chip.

8 Claims, 17 Drawing Sheets

MANUFACTURING METHOD OF A SEMICONDUCTOR DEVICE

This application is a Rule 53(b) divisional application of application Ser. No. 09/381,400, filed Feb. 3, 2000, now abandoned the subject matter of which is incorporated herein by reference. U.S. application Ser. No. 09/381,400 is the U.S. National Stage of International Application No. PCT/JP98/01219, filed Mar. 20, 1998, the subject matter of which is incorporated herein by reference.

TECHNICAL FIELD

This invention relates to a semiconductor device and its manufacturing method, especially to a reliable technique applying for the resin mold package that seals a semiconductor chip mounted on the die pad of a lead frame.

BACKGROUND TECHNIQUE OF THE INVENTION

A surface mounted type resin mold package of QFP (QUAD FLAT PACKAGE), etc. becomes a problem that is important to prevent the package crack that occured in the solder reflow process at the time of a surface mounting of the package. After molding a resin by the transfer mold method, some extent of moisture in the atmosphere has penetrated into the package because the resin that constitutes a package has absorbency. Therefore, heat at the time of a temperature cycle test after package completion, moisture in the resin is suddenly vaporized and expanded by heat at the time of soldering a package to the printed circuit board, and a package crack is caused. As for a package crack that happened like this, it is known that it is especially easy to generate it in the vicinity of the interface between the back of a die pad on which a semiconductor chip is mounted and a resin surrounding it. This is because the adhesion strength of the metal that constitutes a lead frame and a resin is relatively weak, and especially because the die pad is the widest area in the lead frame sealed to the package, a resin breaks away locally from the back of the die pad by the reason why the heat stress that occurs at the time of a resin sealing process is large and moisture has accumulated in that portion.

The Japanese patent Laid-open No. Toku-Kai-Syou 63-204753 official gazette and the Japanese patent Laid-open No. Toku-Kai-Hei 6-216303 official gazette are proposing the lead frame structure that restrains an occurrence of a package crack, that is, they are proposing the lead frame structure which has the die pad whose outward appearance is smaller than that of the semiconductor chip mounted on it. According to this lead frame structure, an interface of a die pad and a resin becomes small, and the quantity of accumulated moisture also becomes small in the interface of them. And the occurrence of a package crack in the back vicinity of a die pad is restrained because a part of the back of a silicon wafer with good adhesion with a resin as compared with a lead frame comes to touch a resin and makes a direct interface.

On the other hand, as for the side of the main surface (element formation surface) of a chip mounted on a die pad, the surface passivation film (final passivation film) formed to the top layer part of a chip contacts with the resin that constitute a package. This final passivation film is made of inorganic system insulation materials such as the silicon oxide film or the silicon nitride film that formed by the method of a CVD (CHEMICAL VAPOR DEPOSITION), and the adhesion strength with the resin that constitutes a package is larger than that of a lead frame (metal) and a resin.

In case of the resin mold package that used the above lead frame structure which the outward appearance of a die pad is smaller than that of a chip mounted on it, the package crack in the interface vicinity of the back of a die pad and the resin is restrained, but the adhesion strength of the surface of a chip and a resin does not change.

Therefore, in case a package has a lot of moisture-absorption quantities, a package crack occurs on the side of the surface of a chip because an adhesion strength of the side of the surface of a chip relatively declined comparing to the side of the back of a die pad. And the serious defective as like as a breaking of wires was caused by these problems which has been clarified by the inventors.

The purpose of this invention is providing the technique that can improve reflow crack resistance of a resin package.

The foregoing and other purposes of this invention, and the new feature of this invention will be described with reference to the accompanying drawings.

DISCLOSURE OF THE INVENTION

The outline of the invention that is disclosed in this application is explained as follows.

The semiconductor device of this invention is the package that seals a semiconductor chip mounted on the die pad of a lead frame by a resin. And the outward appearance of the above die pad is smaller than that of a semiconductor chip mounted on it. By doing so, the occurrence of a package crack in the vicinity of the back of the above die pad is restrained, and by forming a layer of organic material with good adhesion with the resin that constitutes a package on the surface passivation film (final passivasion film) that covers the top layer of conductive wirings of the above semiconductor chip, the occurrence of a package crack in the main face vicinity of the above semiconductor chip is restrained.

Besides, a gist of the invention stated in this application is itemized and is explained as follows.

(1) The semiconductor device of this invention is composed of the package that seals the die pad of a lead frame and a semiconductor chip mounted on it by resin, and coating the main surface of the above semiconductor chip with an layer of organic material, and the outward appearance of the above die pad was made smaller than the outward appearance of the above semiconductor chip.

(2) As for the semiconductor device of this invention, the layer of organic material of the foregoing (1) is composed of a polyimide resin.

(3) As for the semiconductor device of this invention, the layer of organic material of the foregoing (1) is composed of a photosensitive polyimide resin.

(4) As for the semiconductor device of this invention, the final passivation film that comprises the insulation materials of an inorganic system in the upper part of the top layer of conductive wirings formed on the main surface of the semiconductor chip of the foregoing (1) is formed, and the above layer of organic material is formed over the above final passivation film.

(5) As for the semiconductor device of this invention, a bonding pad is formed by holing the layer of organic material of the foregoing (4) and the above final passivation film, and this bonding pad and a lead of the above lead frame are electrically connected through a wire.

(6) As for the semiconductor device of this invention, the final passivation film of the foregoing (4) is composed of one of silicon oxide film, silicon nitride film or those lamination films.

(7) As for the semiconductor device of this invention, the lead frame of the foregoing (1) is composed of the Fe—Ni alloy or Cu.

(8) The method of manufacturing the semiconductor device of this invention includes the following steps.

(a) a step of forming the final passivation film that comprises the insulation materials of an inorganic system in the upper part of the top layer of conductive wirings after forming the top layer of conductive wirings on the main surface of a semiconductor wafer, and then an layer of organic material is formed over the above final passivation film.

(b) a step of exposing a surface of a bonding pad by selectively etching the above layer of organic material of the upper part of the top layer of conductive wirings and the above final passivation film, said etching being performed by using a photo resist film formed on the above layer of organic material as a mask.

(c) a step of heating hotly the above layer of organic material after removing the above photo resist film by using a resist removal liquid.

(d) a step of obtaining a semiconductor chip by dicing the above semiconductor wafer.

(e) a step of mounting a semiconductor chip on the die pad by preparing a lead frame with the die pad with an outward appearance that is smaller than the outward appearance of the above semiconductor chip.

(f) a step of sealing the above semiconductor chip and the above die pad by a resin.

(9) As for the method of manufacturing the semiconductor device of this invention, the resist removal liquid of a resist of the foregoing (8) includes the solvent of a phenol system as the main component.

(10) As for the method of manufacturing the semiconductor device of this invention, after above step of (c) and before above step of (d), further including a step of thinning the thickness of the above semiconductor wafer by grinding of the back in the condition that the main surface of the above semiconductor wafer is covered with the second photo resist film and a protect tape, and further a step of heating hotly the above layer of organic material after removing the above protect tape and the second photo resist film by using a resist removal liquid.

(11) The method of manufacturing the semiconductor device of this invention includes the following processes.

(a) a step of forming the final passivation film that comprises the insulation materials of an inorganic system in the upper part of the above top layer of conductive wirings after forming the top layer of conductive wirings on the main. surface of a semiconductor wafer, and then a photosensitive polyimide resin layer is formed over the above final passivation film.

(b) a step of making holes in the above photosensitive polyimide resin layer formed on the upper part of the top layer of conductive wirings by exposing and developing above photosensitive polyimide resin layer (c) a step of exposing a surface of a bonding pad by selectively etching above surface passivation film of the upper part of the top layer of conductive wirings by using above photosensitive polyimide resin layer as a mask.

(d) a step of heating hotly the above photosensitive polyimide resin layer.

(e) a step of obtaining a semiconductor chip by dicing the above semiconductor wafer.

(f) a step of mounting the above semiconductor chip on the above die pad by preparing a lead frame with a die pad having an outward appearance that is smaller than the outward appearance of the above semiconductor chip.

(g) a step of sealing the above semiconductor chip and the above die pad by a resin.

BRIEF EXPLANATION OF A DRAWING

BEST MODE TO PERFORM THE INVENTION

As follows, the examples of the invention are described with reference to the accompanying drawings.

And, the thing that has the same function in all figures to explain the embodiment of the invention puts the same code and omits the repeated explanation.

Figure 1:
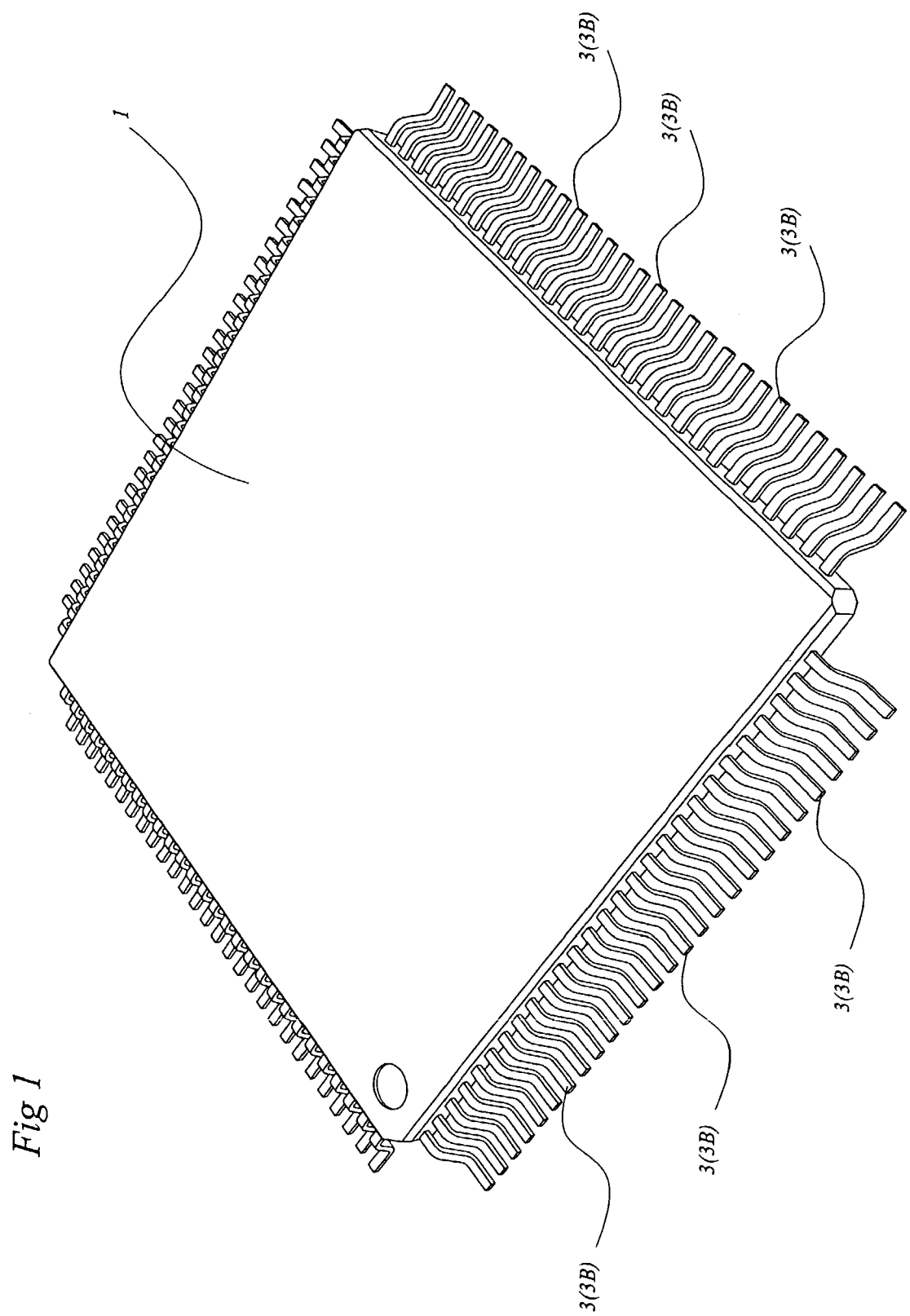
FIG. 1 is the perspective view of TQFP that is one embodiment of this invention.

FIG. 1 is the perspective view of TQFP(THIN QUAD FLAT PACKAGE) of which one embodiment of this invention.

Figure 2:
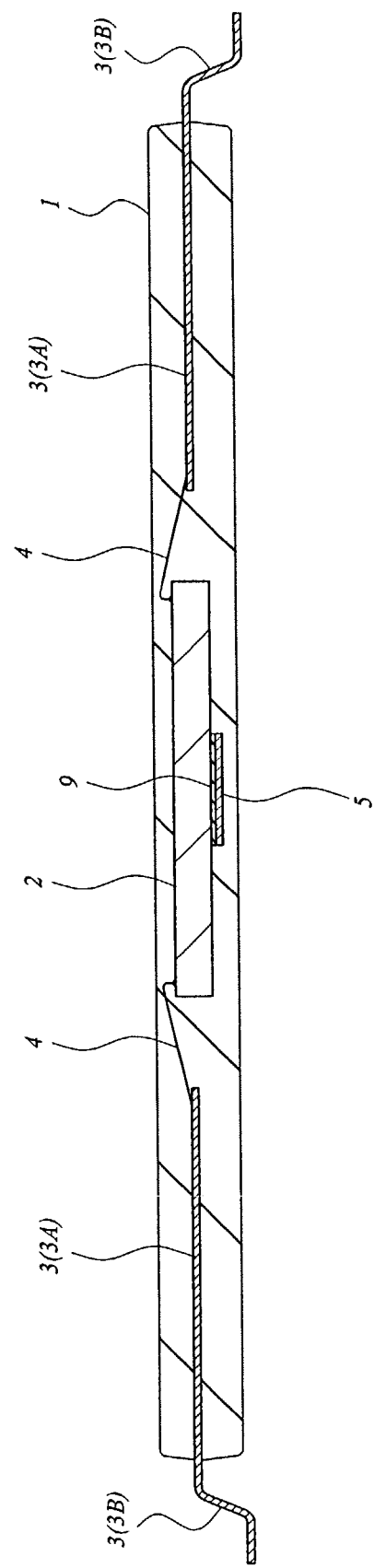
FIG. 2 is the cross-sectional view of TQFP that is one embodiment of this invention.

FIG. 2 is the cross-sectional view of this TQFP.

Figure 3:
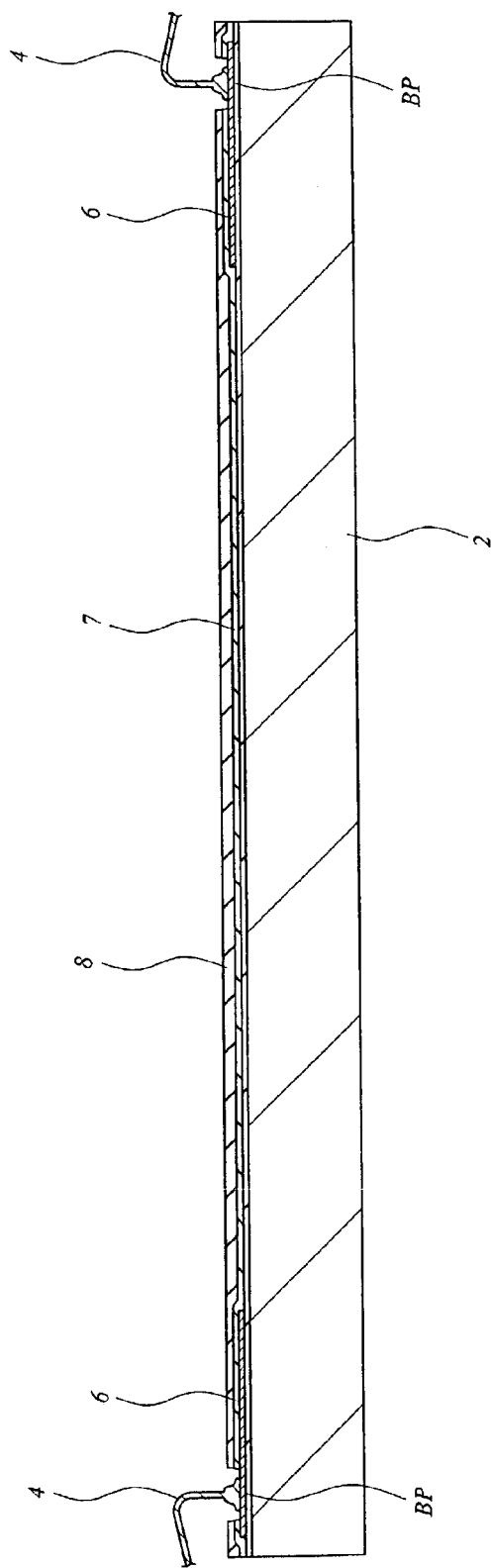
FIG. 3 is the cross-sectional view of a semiconductor chip sealed to TQFP that is one embodiment of this invention.

FIG. 3 is the enlarged sectional view of a semiconductor chip sealed to this TQFP.

As it is shown in FIG. 1 and FIG. 2, the package body 1 of TQFP comprises epoxy system resins formed by the transfer mold method and semiconductor chip 2 is sealed inside of it. This semiconductor chip 2 is made of monocrystal silicon and LSI such as a microcomputer and ASIC is formed on its main surface.

A plurality of the one end parts (inner lead parts 3A) of leads 3 which composes the external connection terminal of TQFP are arranged in the periphery of above semiconductor chip 2. Leads 3 comprises the Fe—Ni alloys such as 42 alloys or Cu. Inner leads part 3A is electrically connected with semiconductor chip 2 through wires 4 made of Au and Al, etc.

And, the other end parts (outer lead parts 3B) of leads 3 are drawn out from the side of the package body 1 to the outside and are formed into a gull-wing form.

Above semiconductor chip 2 is connected through adhesive 9 on die pad 5 made of the same material as leads 3. This die pad 5 is composed of an outward appearance that is smaller than the outward appearance of semiconductor chip 2 mounted on it, and the back side of semiconductor chip 2 directly contacts with a resin except a central part connected to die pad 5.

As it is shown in FIG. 3, an layer of organic material 8 that comprises polyimide resins is formed on surface passivation film (final passivation film) 7 that covers the top layer of conductive wirings 6 of LSI for the side of the main surface (element formation face) of semiconductor chip 2, and this layer of organic material 8 contacts with epoxy system resin which constitutes the package body 1.

The top layer of conductive wirings 6 of LSI comprises for example, the Al alloys, and final passivation film 7 on them comprises inorganic system insulation materials such as the silicon oxide film or the silicon nitride film that formed by the CVD method.

One end parts of wires 4 to which semiconductor chip 2 and inner leads part 3A are connected are connected to the bonding pads BP which are formed by holing the final passivation film 7 that covers the top layer of conductive wirings 6 and the layer of organic material 8 on them.

According to TQFP of this embodiment that the outward appearance of die pad 5 is smaller than that of semiconductor chip 2 on it, the area of a part where the resin that constitutes the package body 1 and die pad 5 touch and make an interface becomes small, and part of the back of semiconductor chip 2 of which adhesion strength with a resin is better than that of die pad 5 comes to touch a resin and makes a direct interface. Therefore, the occurrence of a package crack in the back vicinity of die pad 5 is restrained.

Further, according to TQFP of this embodiment that formed layer of organic material 8 that comprises polyimide resins that are the insulation materials of the same organic system as the epoxy system resin that constitutes the package body 1 on surface passivation film (final passivation film) 7 that covers the top layer of conductive wirings 6 of LSI, the occurrence of a package crack in the main surface vicinity of semiconductor chip 2 is restrained because the layer of organic material 8 with a high affinity (with good adhesion) with a resin as compared with final passivation film 7 that is an inorganic system insulation material comes to touch a resin and makes a direct interface.

That is, according to TQFP of this embodiment, good adhesion with a resin which organizes the package body 1 is improved at the both side of the back of die pad 5 and of the main surface of semiconductor chip 2. Therefore, TQFP that reflow crack resistance improved can be realized.

Figure 12:
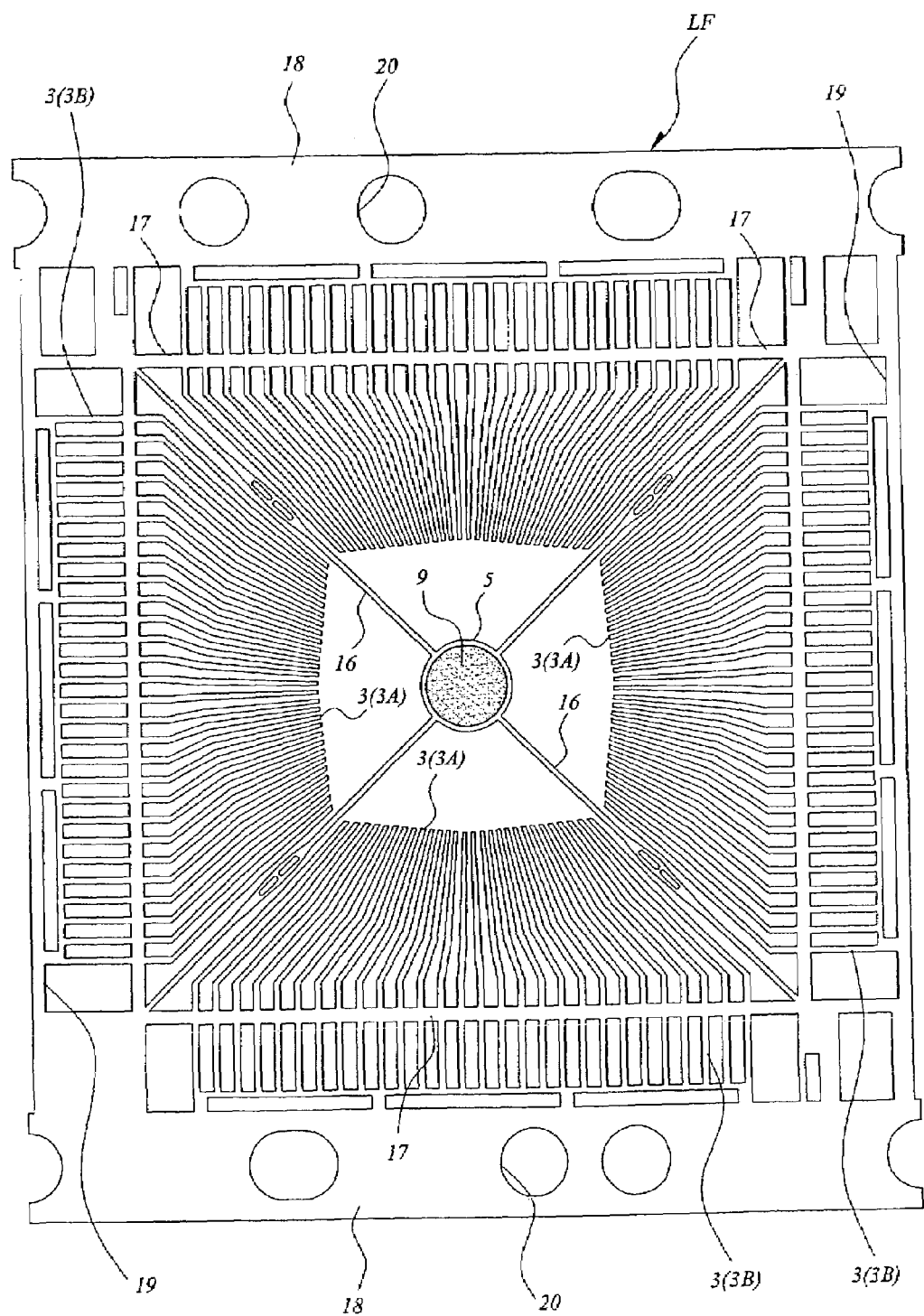
FIG. 12 is the explanation figure that shows the process that mounts a semiconductor chip on a die pad.
Figure 13:
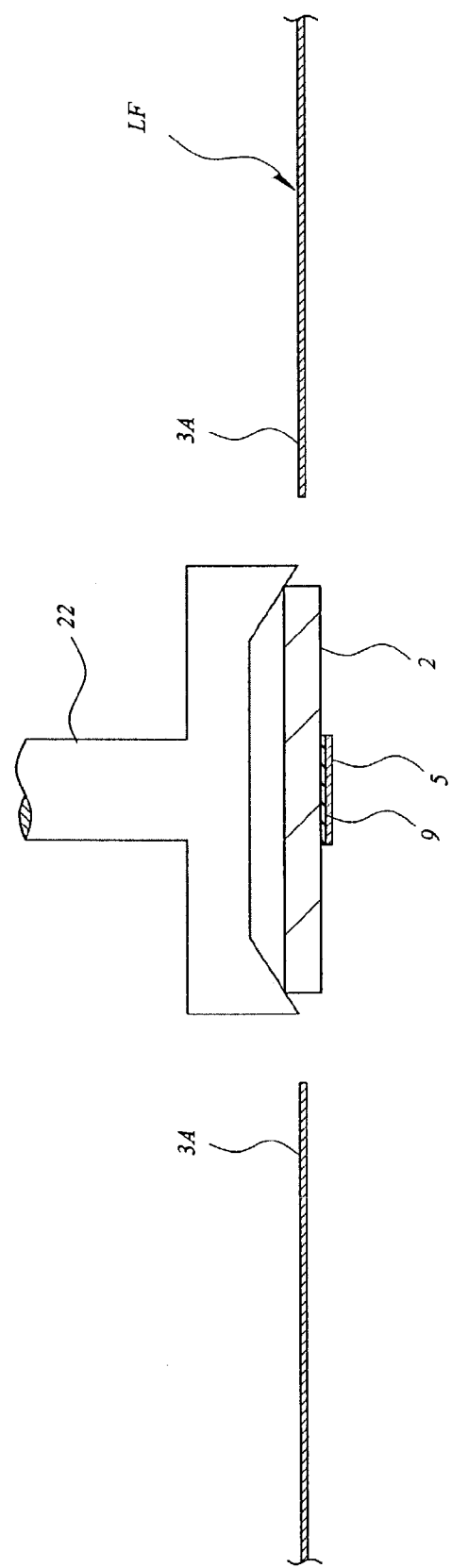
FIG. 13 is the explanation figure that shows the process that mounts a semiconductor chip on a die pad.
Figure 14:
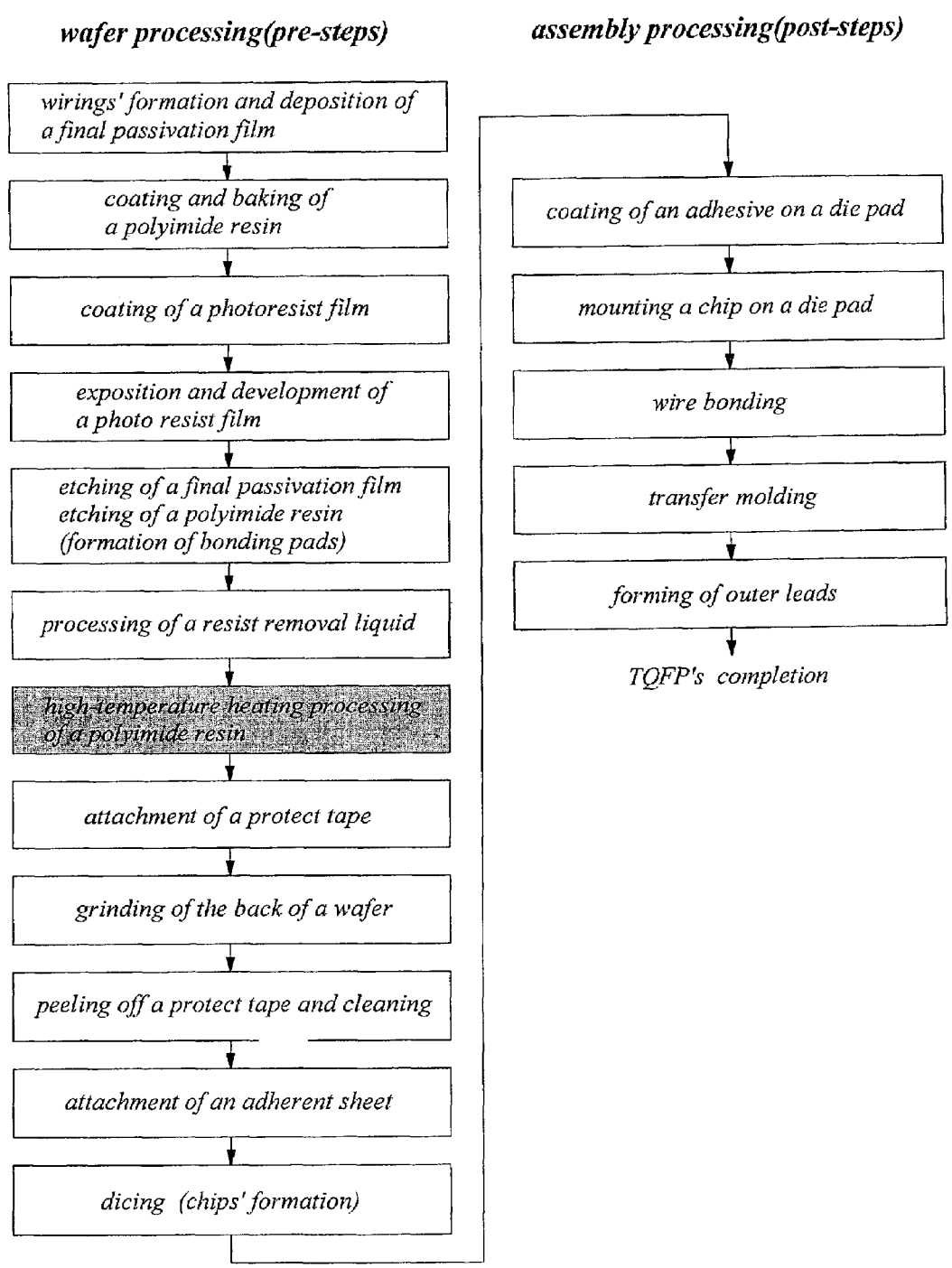
FIG. 14 is the flow diagram that shows the manufacturing process of TQFP that is one embodiment of this invention.

Then, a method of manufacturing TQFP of this embodiment composed like above is explained by using FIG. 4–FIG. 13 and the process flow figure of FIG. 14.

Figure 4:
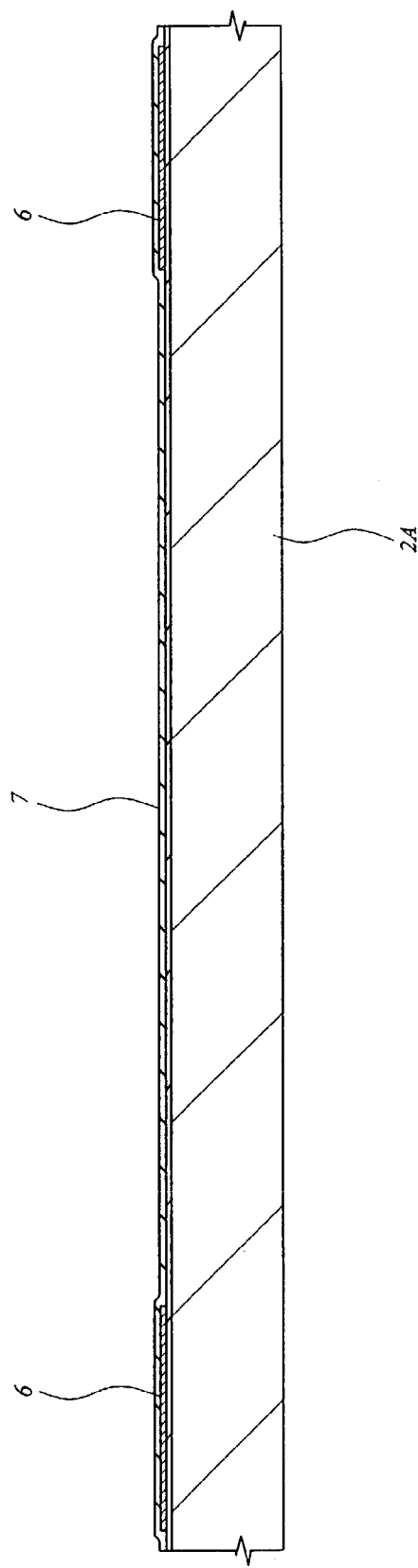
FIG. 4 is the main part cross-sectional view of the semiconductor wafer that shows a method of manufacturing TQFP that is one embodiment of this invention.

FIG. 4 is the cross-sectional view that shows the main part (about one chip) of semiconductor wafer 2A that deposits final passivation film 7 on the upper part of the top layer of conductive wirings 6 for example are formed by the method of patterning Al alloy film deposited on semiconductor wafer 2A by sputtering method. And, final passivation film 7 for example is formed by depositing a silicon oxide film or a silicon nitride film on semiconductor wafer 2A by the CVD method.

Figure 5:
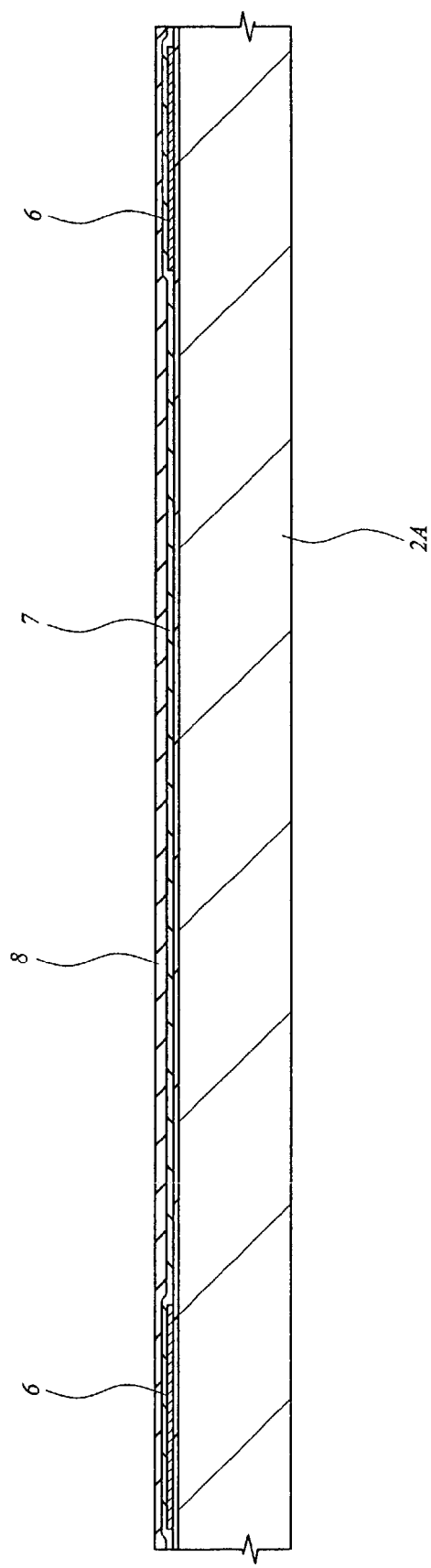
FIG. 5 is the main part cross-sectional view of the semiconductor wafer that shows a method of manufacturing TQFP that is one embodiment of this invention.
Figure 6:
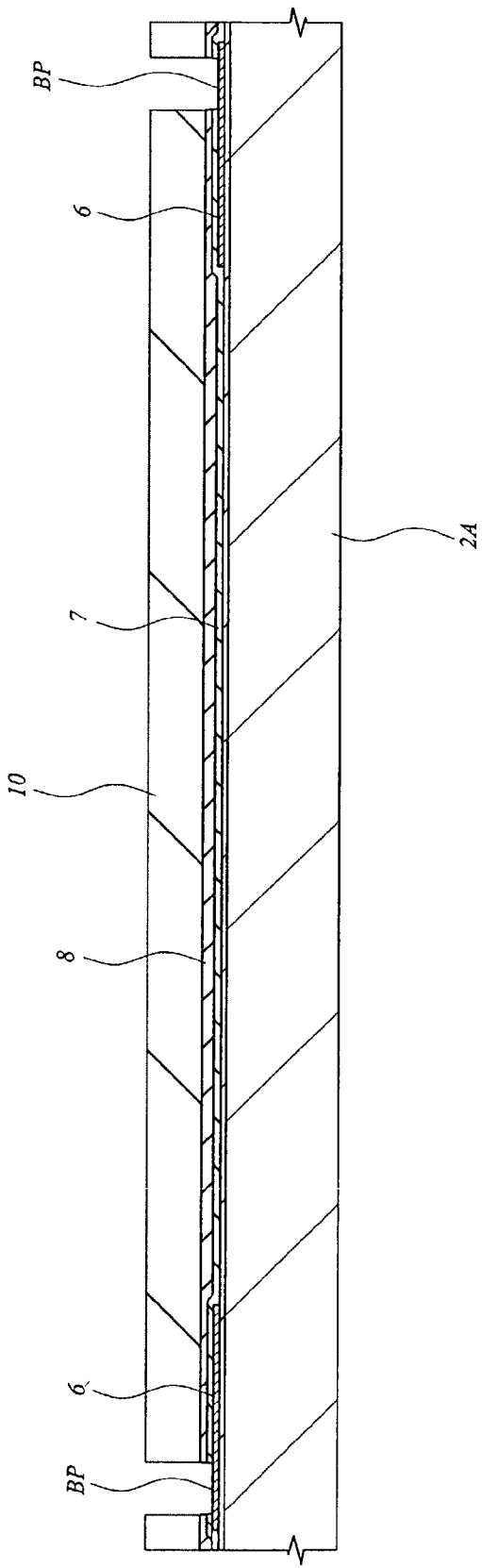
FIG. 6 is the main part cross-sectional view of the semiconductor wafer that shows a method of manufacturing TQFP that is one embodiment of this invention.

Then, as it is shown in FIG. 5, after forming layer of organic material 8 by baking polyimide resin applied by spin method to the upper part of final passivation film 7 at around 180 degree in centigrade temperature, a photo resist film 10 in which a bonding pad formation area was holed to the upper part of layer of organic material 8 is formed as it is shown in FIG. 6.

And bonding pad BP is formed by making holes into layer of organic material 8 and final passivation film 7 by dry etching that made this photo resist film 10 a mask and exposing the top layer of conductive wirings 6.

Figure 7:
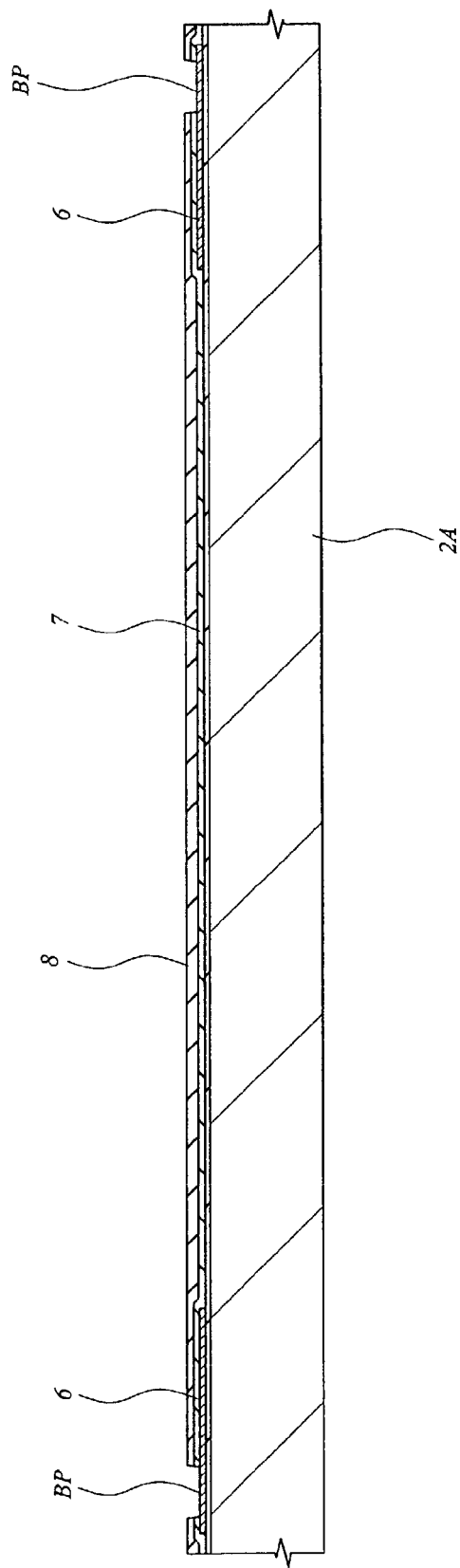
FIG. 7 is the main part cross-sectional view of the semiconductor wafer that shows a method of manufacturing TQFP that is one embodiment of this invention.
Figure 8:
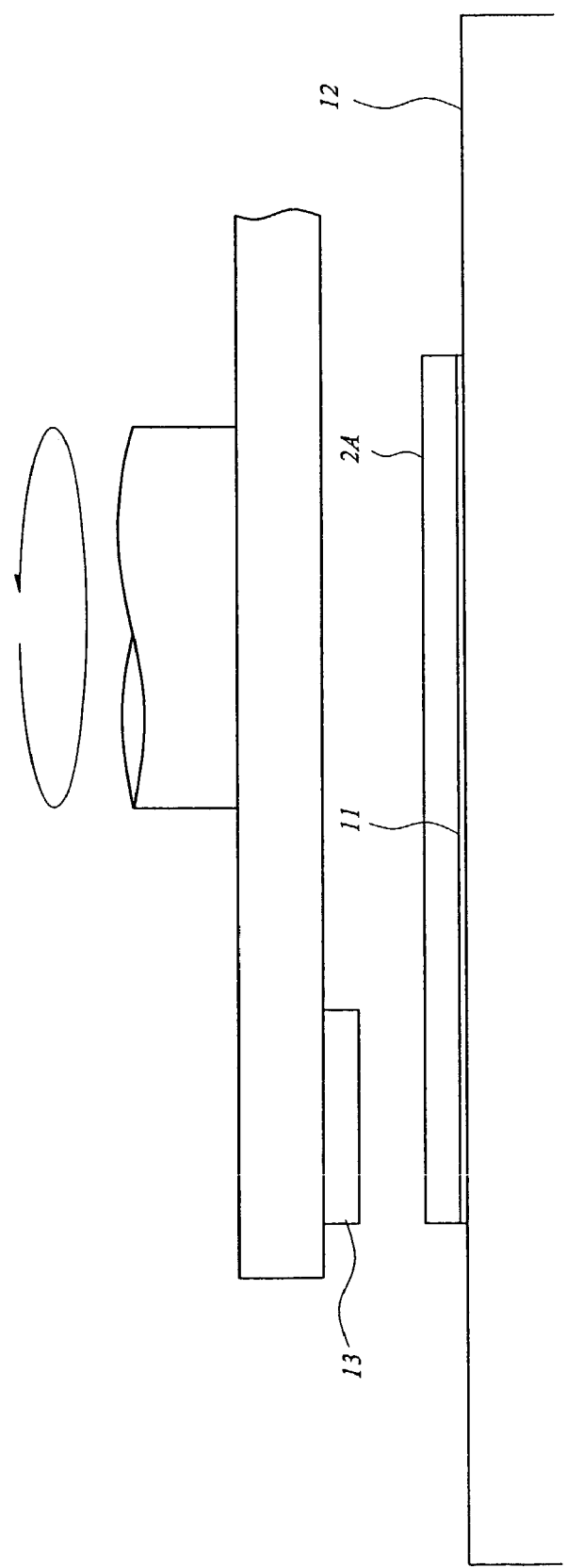
FIG. 8 is the explanation figure that shows the back grinding process of a semiconductor wafer.

Then, as it is shown in FIG. 7, photo resist film 10 left on the layer of organic material 8 is removed by using a resist removal liquid. This resist removal liquid is composed of the organic solvents that contain the solvent of for example, phenol system as the main component.

In the removal process of photo resist film 10 that uses the above resist removal liquid, metamorphosis is occurred to the surface of layer of organic material 8 that is composed of polyimide resins that are the insulation materials of the same organic system as photo resist film 10 by the bleaching to the resist removal liquid, and the adhesion strength (the bonding power) with the resin that constitutes the package body 1 declines. Then, in this embodiment, the good adhesion (the bonding power) with a resin is recovered by heating the layer of organic material 8 for 4 minutes or more at 350 degrees in centigrade high temperature for example, after removing photo resist film 10. Therefore, the bonding power between the resins constituting the package body 1 and the polyimide resins constituting the layer of organic material 8 is nearly equal to the adhesion strength (the bonding power) between the semiconductor chip 2 and the resins in the back side thereof.

Thus, according to the present embodiment, by making the outward appearance of the die pad 5 smaller than that of the semiconductor chip 2, the adhesion strength between the resins and the layer of organic material 8 becomes strong in the front side of the semiconductor chip 2 whose the bonding power has relatively declined in comparison to the resins, so that both the occurrence of a package crack in the main surface of the semiconductor chip 2 and that of a package crack in the back vicinity of the die pad 5 can be restrained.

Then, the back of semiconductor wafer 2A is ground and the thickness is thinned to 0.4 mm in order to seal semiconductor chip 2 to the TQFP package of which a thickness is 1 mm. The back grinding of semiconductor wafer 2A is done by fixing semiconductor wafer 2A that attached surface protect tape 11 to the main surface side on stage 12 and by grinding the back in diamond wheel 13 that at high speed turns as it is shown in for example, FIG. 8.

Figure 9:
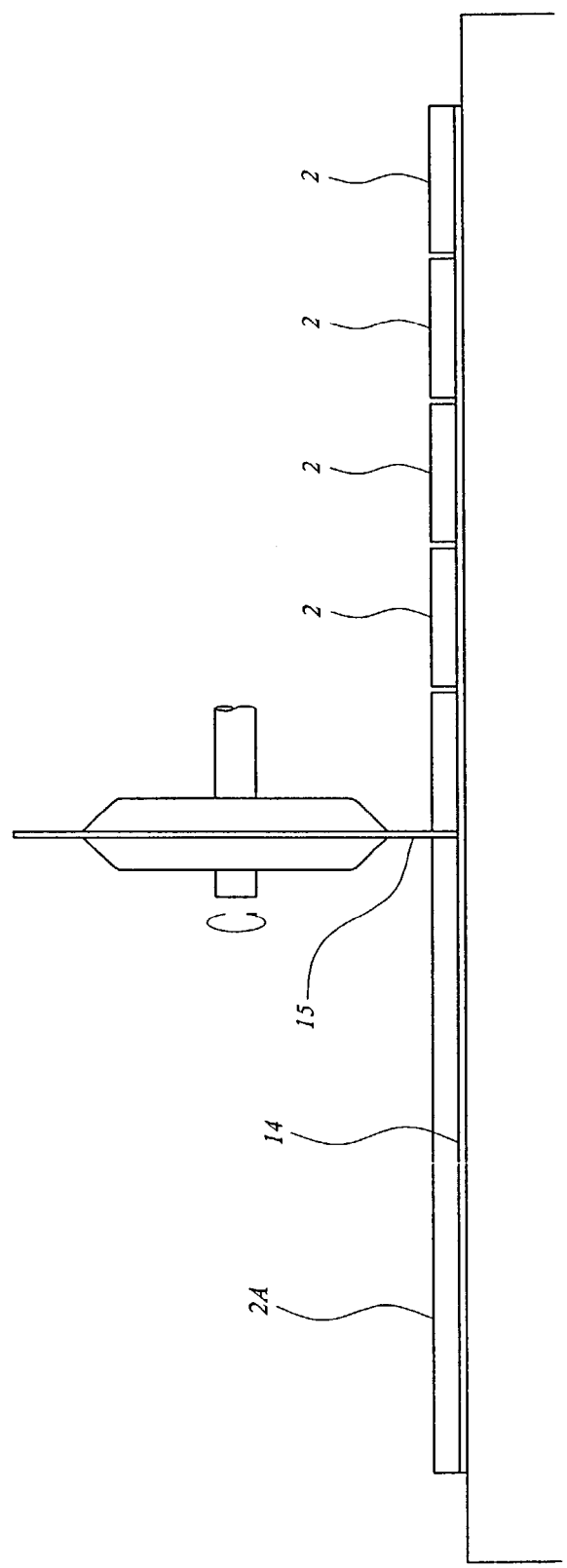
FIG. 9 is the explanation figure that shows dicing process of a semiconductor wafer.

Then, surface protect tape 11 attached to the main surface of semiconductor wafer 2A is peeled off and cleaning process to remove foreign materials such as an adherent agent is done, and then, as it is shown in FIG. 9, the semiconductor chip 2 is gained by attaching adherent sheet 14 to the side of the back of semiconductor wafer 2A and separating it into chips by using dicing blade 15.

Figure 10:
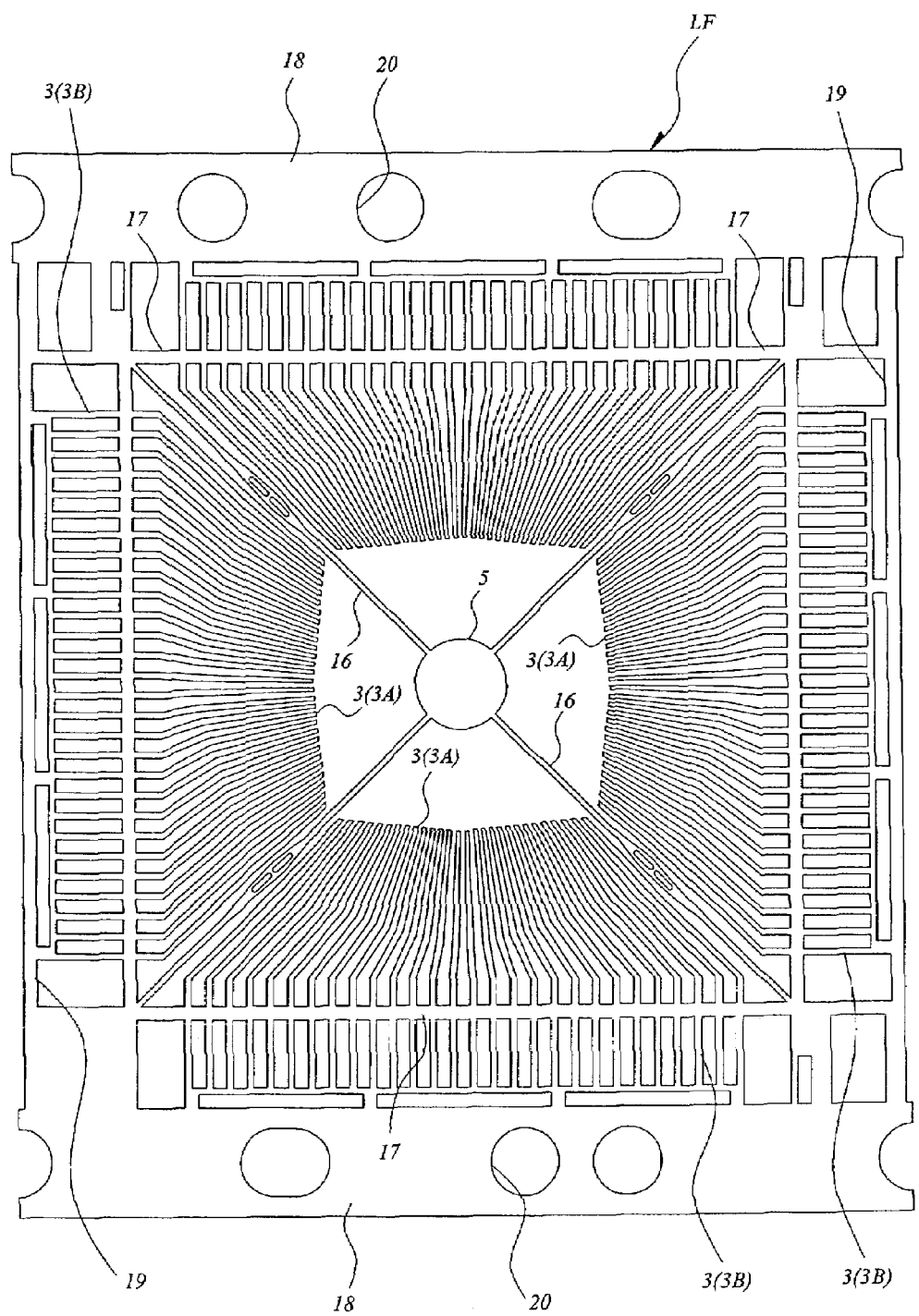
FIG. 10 is the main part plan view of the lead frame that is used for manufacturing of TQFP that is one embodiment of this invention.

Then, given semiconductor chip 2 is mounted on a lead frame. As it is shown in FIG. 10, circular die pad 5 that mounts semiconductor chip 2 on the central part of lead frame LF is supported by suspension leads 16 of 4 pieces. As described above, a remarkable point is that the size of this die pad 5 is smaller than the size of semiconductor chip 2 that is mounted on it.

it is arranged to the periphery of above die pad 5 so that the die pad 5 is surrounded by a plurality of leads 3, and it is formed to the halfway part of each leads 3 so that dam bar 17 that served as support of leads 3 and prevention of overflow of a resin at the time of molding connects leads 3 each other. As for leads 3, the inside part of this dam bar 17 composes inner leads part 3A, and outer leads part 3B is composed of the outside part. And, plating of Ag/Ni is done on the tip (bonding area) of inner leads part 3A. External frame 18 and inside frame 19 are formed to most outward part of lead frame LF, and guide hole 20 that becomes a guide at the time of the positioning to the molded die assembly of lead frame LF is formed to part of external frame 18. And, while actual lead frame LF becomes matrix structure on which 5~6 semiconductor chips 2 can be mounted, the figure is shown only one chip area (unit frame).

Above die pad 5, suspension leads 16, leads 3, dam bar 17, external frame 18 and inside frame 19 that constitute lead frame LF are formed by manufacture of press working or etching of the hoop material of thickness of sheet 0.15 mm that comprises 42 alloys and Cu, etc. And, in case above each part of lead frame LF is formed by press working, burr (BURR) occurs on the side of the back of a cutting place. A semiconductor chip 2 cannot be bonded when a burr forms in the periphery of die pad 5 because this lead frame LF is composed of the die pad 5 which has the area smaller than the area of semiconductor chip 2 mounted on that.

Therefore, a burr is made to form in the other side of a chip mounting surface by turning a chip mounting surface to an upper part when pressing die pad 5 and punching it from the upper part to downward. On the other hand, as for a wire, when there is a burr in the under side, it is hard to bond the tip of inner lead part 3A at the time of wire bonding, and the bonding inferior sometimes arises. Therefore, when pressing inner lead part 3A, a bonding surface is turned to upside down and is punched from the upper part to downward, and a burr is made to the wire bonding surface side.

And, down set manufacture is done on lead frame LF after the above press working (etching manufacture). Down set manufacture is the work that makes the height of die pad 5 looked at from the level direction lower than the height of lead 3 by bending the halfway part of suspension leads 16 to the lower part by using a press type (no illustration). By this down set manufacture, when installing lead frame LF on which semiconductor chip 2 is mounted in a molded die assembly and molding a package, occurrence of mold inferior as a void etc. can be prevented because the thickness of a resin becomes almost equal on the side of the over surface of semiconductor chip 2 and the side on the underneath of die pad 5.

Figure 11:
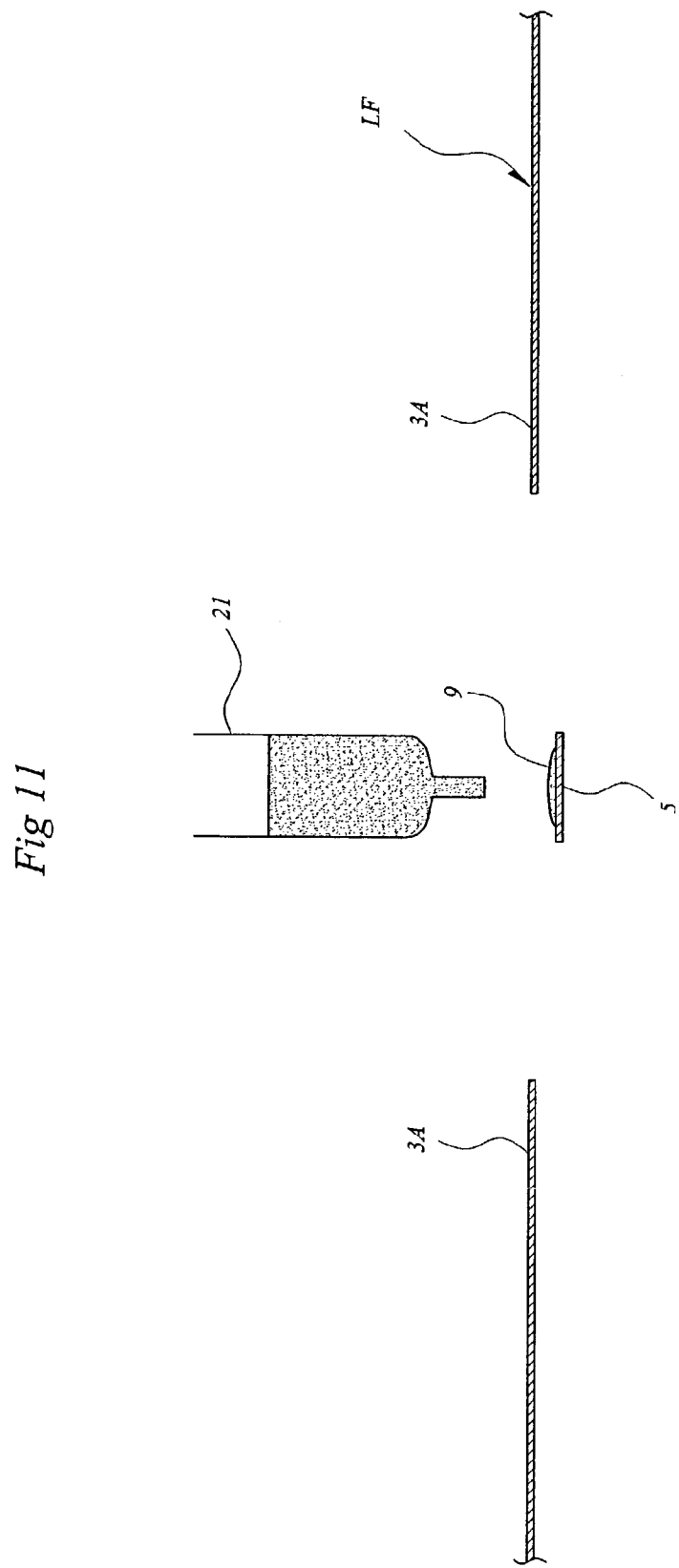
FIG. 11 is the explanation figure that shows the process that mounts a semiconductor chip on a die pad.

As it is shown in FIG. 11 and FIG. 12, adhesive 9 is applied by using dispenser 21 on die pad 5 of lead frame LF in order to mount semiconductor chip 2 on above lead frame LF. Adhesive 9 is composed of the epoxy system resins of thermal hardening mixed with for example, the Ag powder. It is fine by only applying adhesive 9 to one point of the surface of die pad 5 as for lead frame LF, because the area of die pad 5 is small. Therefore, adhesive 9 can be applied in short time, and an application quantity also finishes in the small quantity.

Then, as it is shown in FIG. 13, lead frame LF is heated to 200~250 degrees in centigrade and adhesive 9 is hardened after positioning semiconductor chip 2 on die pad 5 of lead frame LF by using collet 22.

After that, semiconductor chip 2, die pad 5, inner leads part 3A and wires 4 are sealed to the package body 1 by using a molded die assembly (no illustration) after connecting bonding pads BP of semiconductor chip 2 and inner leads part 3A of leads 3 with wires 4 by using wire bonding equipment (no illustration), and finally the molding to the gull-wing form of outer lead part 3B completes TQFP that is shown in above FIG. 1 and FIG. 2 after cutting and excluding dam bar 17, external frame 18, inside frame 19, etc. that crop out in the outside of the package body 1 in the press.

Table 1 of the next page is showing a result that reflow crack resistance was compared in QFP that seals semiconductor chip 2 that formed layer of organic material 8 on final passivation film 7 by a resin and QFP that seals semiconductor chip 2 that does not form layer of organic material 8 a resin. And, the layer of organic material 8 did high-temperature heating processing and close adhesion with a resin was recovered after removing photo resist film 10 used as an etching mask when forming bonding pads BP in the resist removal liquid.

TABLE 1

(moisture-absorption condition: 85° C./85% RH package thickness: 2 mm)

| Moisture-Absorption time | Presence or absence of an layer of organic material | Chip size | Chip surface exfoliation | Crack |
| --- | --- | --- | --- | --- |
| 24 hours | P (high-temperature heating) | 6.48 × 6.66 | 0/45 | 0/45 |
| 48 hours | P (high-temperature heating) | 6.48 × 6.66 | 0/45 | 0/45 |
| 24 hours | Absence | 6.38 × 8.38 | 45/45 | 2/45 |
| 48 hours | Absence | 6.38 × 8.38 | 40/40 | 1/40 |

As it is clear from the above table, when layer of organic material 8 was formed out on final passivation film 7, there were no exfoliation and package crack of the chip surface side, but when layer of organic material 8 was not formed, an exfoliation of the chip surface side was generated and a package crack occurred in all QFP.

This invention was concretely explained above on the basis of an embodiment but, needless to say, this invention is not limited to the above embodiment and it is possible to change it in the range that does not deviate from a gist of the invention.

Figure 15:
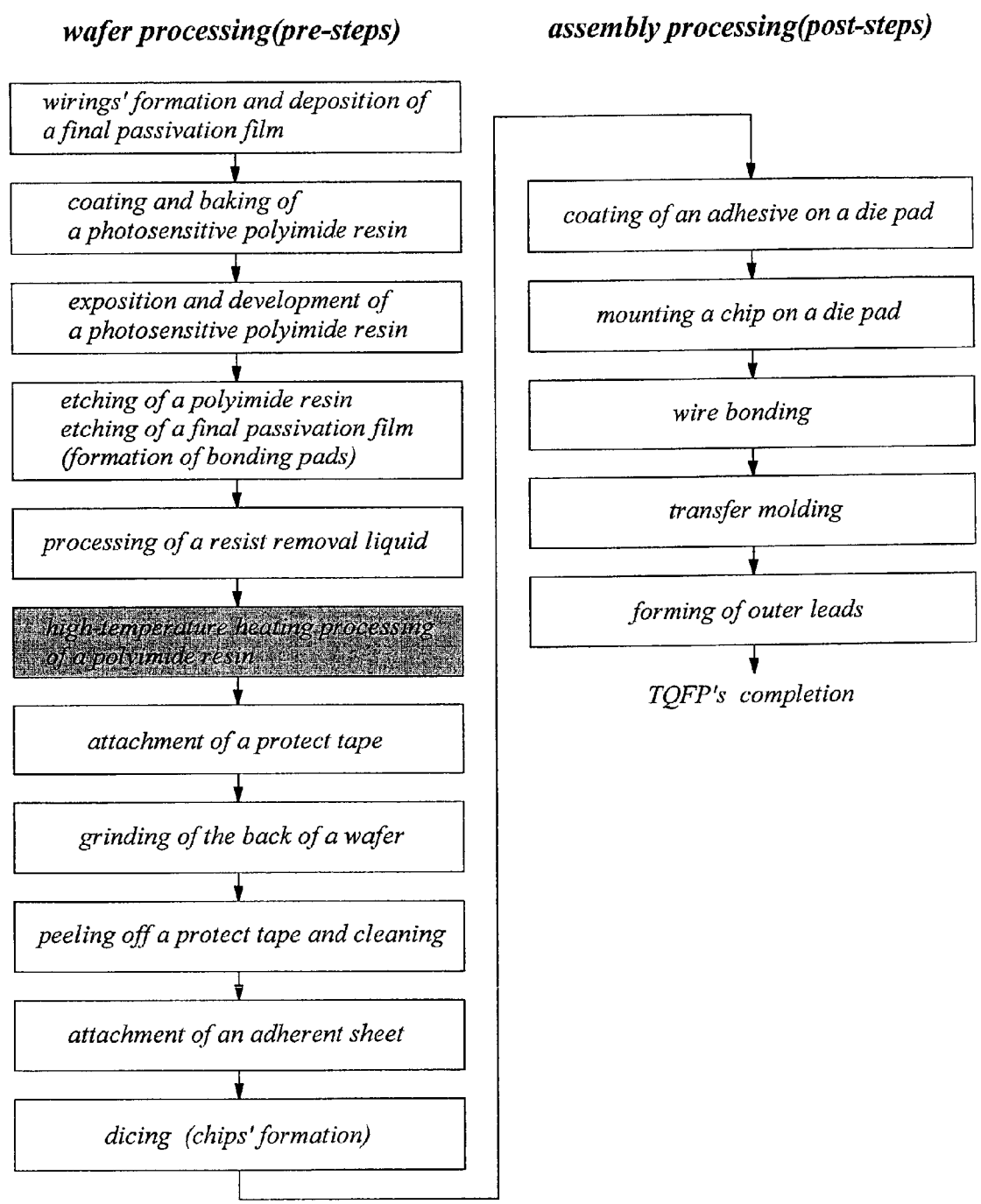
FIG. 15 is the flow diagram that shows the manufacturing process of TQFP that is the other embodiment of this invention.

In the above embodiment, a bonding pad was formed by the hole which was formed to an layer of organic material and a final passivation film by the etching that made a photo resist film a mask after forming the layer of organic material that composed of polyimide resins in the upper part of a final passivation film. And also an layer of organic material can be formed by using a photosensitive polyimide resin. In this case, as it is shown in FIG. 15, after forming hole opening to the upper part of a bonding pad formation area by exposing and developing a photosensitive polyimide resin, the bonding pad is formed by using the hole which was formed to the final passivation film by the etching that made this photosensitive polyimide resin a mask.

In this case, adhesion strength with the resin that constitutes the package body declines because the surface is exposed to developer in the development process of a photosensitive polyimide resin and is further exposed to an etching liquid when a surface passivation film is holed by wet etching. Therefore, the adhesion strength with a resin is recovered by heating the photosensitive polyimide resin for 4 minutes or more at 350 degrees in centigrade high temperature for example after forming a bonding pad.

Figure 16:
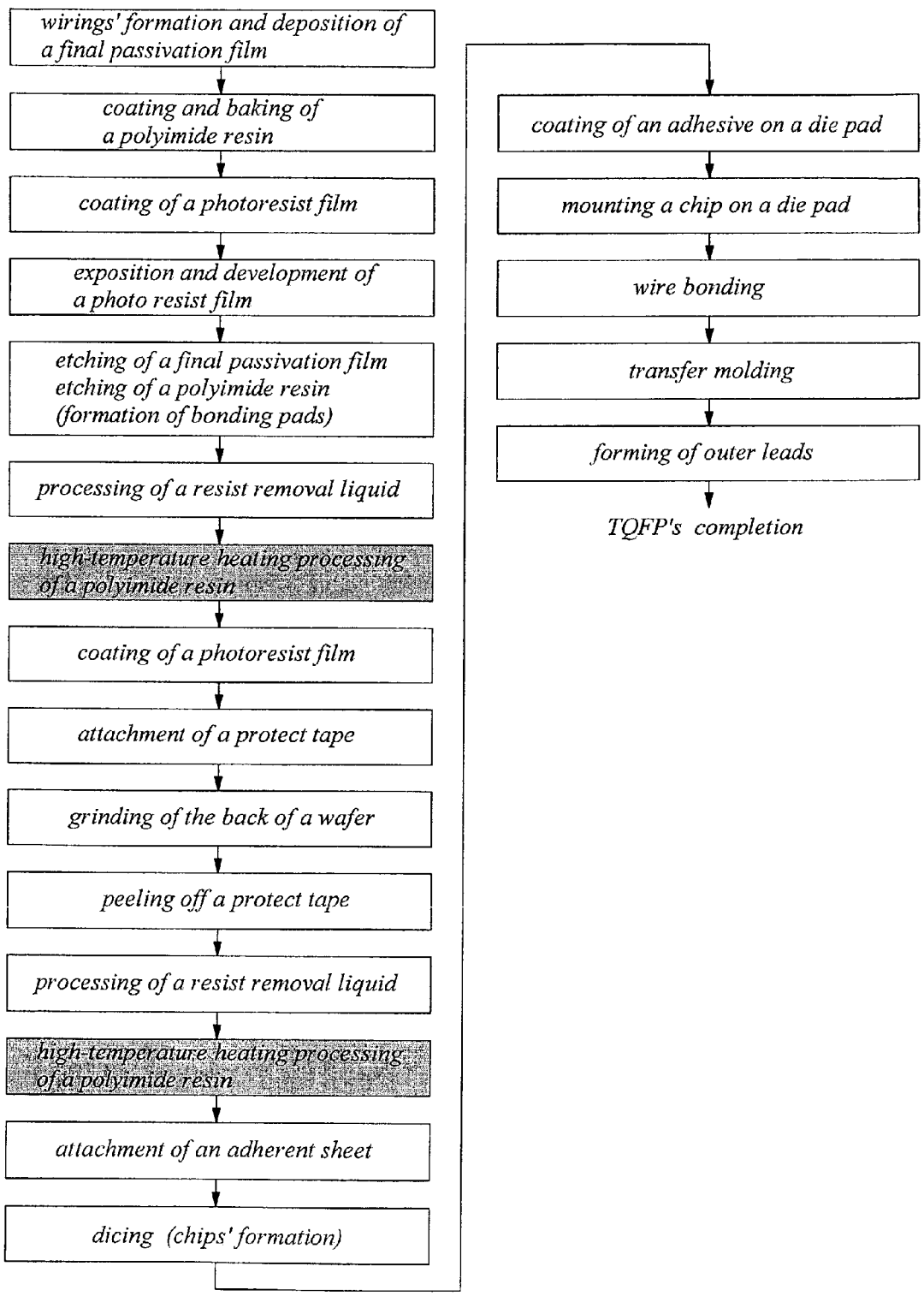
FIG. 16 is the flow diagram that shows the manufacturing process of TQFP that is the other embodiment of this invention.
Figure 17:
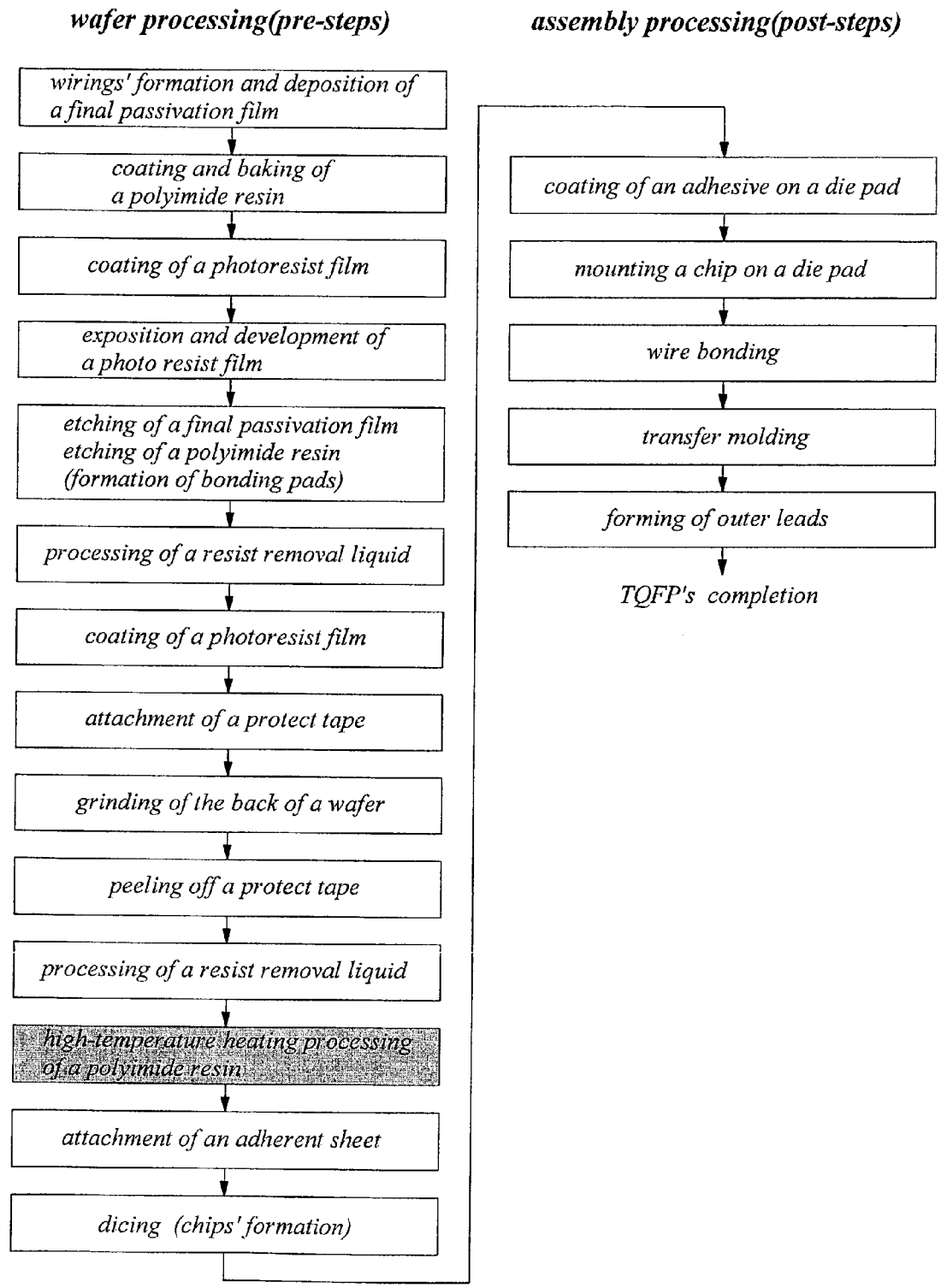
FIG. 17 is the flow diagram that shows the manufacturing process of TQFP that is the other embodiment of this invention.

And also, in the process that grinds the back of a semiconductor wafer, a surface protect tape can be attached on that after applying a photo resist film to the main face in order to protect the main surface of a wafer, and then the back grinding can be done. In this case, as it is shown in FIG. 16, because it is necessary to remove the photo resist film of the lower layer by using a resist removal liquid after the back grinding of a wafer and peeling off a protect tape, the surface of the layer of organic material that composed of polyimide resins is exposed in the resist removal liquid and metamorphosis is occurred, and adhesion with the resin that constitutes the package body declines. Then, after removing this photo resist film, adhesion with a resin is recovered by heating a polyimide resin again. In this case, as it is shown in FIG. 17, a photo resist film and a surface protect tape are laminated to the part without high-temperature heating of a polyimide resin after removing a photo resist film used to form a bonding pad by using a resist removal liquid, and the back of a wafer is ground, and the photo resist film of the lower layer is removed by using a resist removal liquid after peeling off a protect tape, then a process can be shortened by high-temperature heating of a polyimide resin after that.

The layer of organic material that covers the surface of a semiconductor chip is not limited to a polyimide resin, and in case it is a thing with good adhesion with the inorganic insulation layer that constitutes a final passivation film and the resin that constitute the package body, any organic insulation material can be used.

In case it is the thing that can secure the lowest application area of a chip and the adhesion intensity of an adhesive, the die pad shape of a lead frame is not limited circularly, and the shape is optional. And, the reflow crack resistance can be improved further by forming a penetrating hole to part of a die pad and enlarging the adhesion area of a chip and a resin.

A package is not limited to QFP, and it can be applied to any package of a surface mounted type that seals a semiconductor chip mounted on a die pad by a resin.

POSSIBILITY OF THE INDUSTRIAL USE

According to the package structure of this invention, it can be widely applied to a package of a face mounted type that seals a semiconductor chip by a resin because reflow crack resistance of a resin package can be improved.

What is claimed is:

1. A method for making a semiconductor device comprising the steps of:
   (a) making a passivation film of inorganic insulation materials on a top layer of conductive wirings after forming the top layer of conductive wirings on a main surface of a semiconductor wafer, and then making a layer of organic material on said passivation film,
   (b) making a bonding pad by holing said layer of organic material and said passivation film on said top layer of conductive wirings by the etching that makes a photo resist film formed on said layer of organic material a mask,
   (c) heating said layer of organic material after removing said photo resist film by using a resist removal liquid,
   (d) making a semiconductor chip by dicing said semiconductor wafer,
   (e) mounting said semiconductor chip on a die pad after preparing a lead frame with said die pad with an outward appearance that is smaller than that of said semiconductor chip,
   (f) sealing said semiconductor chip and said die pad by resin mold, and
   wherein said method provides, between the step (c) and the step (d), a thinning of thickness of said semiconductor wafer by grounding the back of said semiconductor wafer in the state that the main surface of said semiconductor wafer is covered with a second photo resist film and a protect tape and then heating said layer of organic material.

2. A method for making a semiconductor device according to claim 1, wherein said resist removal liquid includes a phenol system solvent as the main component.

3. A method for making a semiconductor device comprising the steps of:
   (a) making a passivation film of inorganic insulation materials on a top layer of conductive wirings after forming the top layer of conductive wirings on the main surface of a semiconductor wafer, and then covering said passivation film with a layer of organic material,
   (b) etching a part of said layer of organic material by using a first photo resist film as a mask,
   (c) baking said layer of organic material after removing said photo resist film by using a resist removal liquid,
   (d) grounding the back surface of said semiconductor wafer after covering said layer of organic material with a second photo resist film,
   (e) backing said layer of organic material after removing said second photo resist film by using a resist removal liquid.
   (d) mounting, after separating said semiconductor wafer into a plurality of semiconductor chips, a semiconductor chip on a die pad of a lead frame with an outward appearance which is smaller than that of said semiconductor chip, and then sealing said semiconductor chip and said die pad by resin mold.

4. A method for making a semiconductor device according to claim 3, wherein the step (e) is performed at such a temperature that the bonding power between said layer of organic material and said resins is recovered.

5. A method for making a semiconductor device comprising the steps of:
   (a) making a passivation film of inorganic insulation materials on a top layer of conductive wirings after forming the top layer of conductive wirings on the main surface of a semiconductor wafer, and then covering said passivation film with a layer of organic material,
   (b) etching a part of said layer of organic material by using a first photo resist film as a mask,
   (c) removing said photo resist film by using a resist removal liquid, and then grounding the back surface of said semiconductor wafer after covering said layer of organic material with a second photo resist film,
   (d) backing said layer of organic material after removing said second photo resist film by using a resist removal liquid, (e) mounting, after separating said semiconductor wafer into a plurality of semiconductor chips, said a semiconductor chip on a die pad with en outer appearance which is smaller than that of said semiconductor chip, and then sealing said semiconductor chip and said die pad by resin mold.

6. A method for making a semiconductor device according to claim 5, wherein the step (d) is performed at such a temperature that the bonding power between said layer of organic material and said resins is recovered.

7. A method for making a semiconductor device comprising steps of:
   (a) making a passivation film of inorganic insulation materials on a top layer of conductive wirings after forming the top layer of conductive wirings on a main surface of a semiconductor wafer, and then covering said passivation film with a photosensitive polyimide resin layer,
   (b) making a hole to an area of said photosensitive polyimide resin layer by exposing and developing said photosensitive polyimide resin layer, and then etching a part of said passivation film by using said photosensitive polyimide resin layer having said hole as a mask,
   (c) grounding the back of said semiconductor wafer after covering said photosensitive polyimide resin layer with a photo resist film whether or not said photosensitive polyimide resin layer is baked,
   (d) backing said photosensitive polyimide resin layer after removing said photo resist film by using a resist removal liquid, and
   (e) mounting, after separating said semiconductor wafer into a plurality of semiconductor chips, said a semiconductor chip on a die pad with an outer appearance which is smaller than that of said semiconductor chip, and then sealing said semiconductor chip and said die pad by resin mold.

8. A method for making a semiconductor device according to claim 7, wherein the step (d) is performed at such a temperature that the bonding power between said photosensitive polyimide resin layer and said resins is recovered.

* * * * *